US012559839B2

(12) United States Patent
Takeda et al.

(10) Patent No.: US 12,559,839 B2
(45) Date of Patent: Feb. 24, 2026

(54) INDIUM COMPOUND, THIN-FILM FORMING RAW MATERIAL, THIN FILM, AND METHOD OF PRODUCING SAME

(71) Applicant: ADEKA CORPORATION, Tokyo (JP)

(72) Inventors: Keisuke Takeda, Tokyo (JP); Masaki Enzu, Tokyo (JP)

(73) Assignee: ADEKA CORPORATION, Tokyo (JP)

( * ) Notice: Subject to any disclaimer, the term of this patent is extended or adjusted under 35 U.S.C. 154(b) by 345 days.

(21) Appl. No.: 18/039,411

(22) PCT Filed: Nov. 30, 2021

(86) PCT No.: PCT/JP2021/043816
§ 371 (c)(1),
(2) Date: May 30, 2023

(87) PCT Pub. No.: WO2022/118834
PCT Pub. Date: Jun. 9, 2022

(65) Prior Publication Data
US 2024/0060177 A1 Feb. 22, 2024

(30) Foreign Application Priority Data
Dec. 4, 2020 (JP) ................................ 2020-201403

(51) Int. Cl.
*C23C 16/40* (2006.01)
*C01G 15/00* (2006.01)
*C07F 5/00* (2006.01)
*C23C 16/455* (2006.01)

(52) U.S. Cl.
CPC ............ *C23C 16/407* (2013.01); *C01G 15/00* (2013.01); *C07F 5/00* (2013.01); *C23C 16/45525* (2013.01)

(58) Field of Classification Search
CPC .............................. C01G 15/00; C23C 16/407
See application file for complete search history.

(56) References Cited

U.S. PATENT DOCUMENTS

2021/0230193 A1 7/2021 Hwang et al.

FOREIGN PATENT DOCUMENTS

JP 6777933 10/2020
KR 10-2010-0054313 5/2010
KR 10-2010-054317 5/2010
KR 10-1629696 6/2016
WO 2019/203407 10/2019

OTHER PUBLICATIONS

T. Maeda, et al, . 39 Journal of Organometallic Chemistry, 87-91 (1972)("Maeda") (Year: 1972).*
International Search Report issued Feb. 8, 2022 in International (PCT) Application No. PCT/JP2021/043816.
Maeda et.al., "Preparation and Properties of Organoindium Complexes", Journal of Organometallic Chemistry, 1972, vol. 39, No. 1, pp. 87-91.

* cited by examiner

*Primary Examiner* — Alexander R Pagano
*Assistant Examiner* — Frank S. Hou
(74) *Attorney, Agent, or Firm* — Wenderoth, Lind & Ponack, L.L.P.

(57) ABSTRACT

Provided is an indium compound, which is represented by the following general formula (1):

(1)

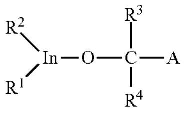

where $R^1$ and $R^2$ each independently represent, for example, an unsubstituted alkyl group having 1 to 5 carbon atoms, $R^3$ and $R^4$ each independently represent, for example, a hydrogen atom or an unsubstituted alkyl group having 1 to 5 carbon atoms, and A represents a group represented by the following general formula (L-1) or (L-2):

(L-1)

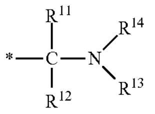

(L-2)

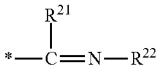

where $R^{11}$, $R^{12}$, $R^{13}$, $R^{14}$, $R^{21}$ and $R^{22}$ each independently represent, for example, a hydrogen atom or an unsubstituted alkyl group having 1 to 5 carbon atoms, and represents a bonding position with C in the general formula (1).

8 Claims, 4 Drawing Sheets

INDIUM COMPOUND, THIN-FILM FORMING RAW MATERIAL, THIN FILM, AND METHOD OF PRODUCING SAME

TECHNICAL FIELD

The present invention relates to an indium compound, a thin-film forming raw material including the indium compound, a thin-film obtained by using the thin-film forming raw material, and a method of producing the thin-film.

BACKGROUND ART

A thin-film containing an indium atom shows specific electrical characteristics, and hence its applications to uses in optoelectronics, such as a semiconductor element, a solar cell, and an LED, have been advanced.

A method of producing a thin-film is, for example, a film formation method including using a vacuum, and examples thereof include a sputtering method, an ion plating method, metal organic decomposition (MOD) methods, such as a coating thermal decomposition method and a sol-gel method, a chemical vapor deposition (CVD) method, and an atomic layer deposition (ALD) method. Of those, a CVD method or an ALD method is mainly used because the thin-film to be obtained has satisfactory quality.

The CVD method and the ALD method are each a vapor phase thin-film formation technology. In particular, the ALD method enables the formation of thin-films having fine shapes because the method enables the control of atomic layers on the surfaces of the thin-films through the growth of materials supplied by precursors to the surfaces of substrates having various compositions. A necessity for the ALD method has been growing because the downsizing of nanotechnology and an electronic device, such as a capacitor electrode, a gate electrode, or an integrated circuit, has been incessantly advanced. A thin-film forming raw material to be used in the ALD method has been required to have a high vapor pressure and excellent thermal stability, and to be capable of forming a high-quality thin-film. The term "high-quality thin-film" described above means that a residual carbon amount in the thin-film is small.

In, for example, Patent Document 1, there is a specific description that an indium oxide thin-film is formed by using, as a precursor, an indium compound that has two indium atoms and is free of any halogen. In Patent Document 2, there is a proposal of an amide compound including, as a precursor of a thin-film forming raw material corresponding to the ALD method or the CVD method, one selected from the group consisting of: aluminum; zinc; indium; and gallium.

CITATION LIST

Patent Document

Patent Document 1: KR 10-1629696 B1
Patent Document 2: WO 2019/203407 A1

SUMMARY OF INVENTION

Technical Problem

However, the related-art precursor containing indium atoms is poor in thermal stability, and hence the quality of a thin-film obtained from the precursor has not been satisfactory.

Accordingly, an object of the present invention is to provide an indium compound, which is excellent in thermal stability, and can produce a high-quality thin-film when used as a thin-film forming raw material. Another object of the present invention is to provide a thin-film forming raw material including the indium compound, a thin-film obtained by using the thin-film forming raw material, and a method of producing the thin-film.

Solution to Problem

The inventors of the present invention have made extensive investigations and have found that the above-mentioned problems can be solved by an indium compound having a specific structure, to complete the present invention.

That is, according to one embodiment of the present invention, there is provided an indium compound, which is represented by the following general formula (I):

(1)

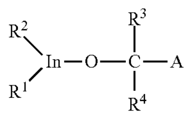

where $R^1$ and $R^2$ each independently represent an unsubstituted alkyl group having 1 to 5 carbon atoms, or an alkyl group having 1 to 5 carbon atoms that is substituted with a fluorine atom, $R^3$ and $R^4$ each independently represent a hydrogen atom, a fluorine atom, an unsubstituted alkyl group having 1 to 5 carbon atoms, or an alkyl group having 1 to 5 carbon atoms that is substituted with a fluorine atom, and A represents a group represented by the following general formula (L-1) or (L-2):

(L-1)

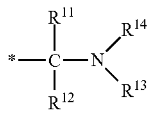

(L-2)

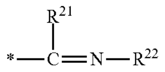

where $R^{11}$, $R^{12}$, $R^{13}$, $R^{14}$, $R^{21}$ and $R^{22}$ each independently represent a hydrogen atom, a fluorine atom, an unsubstituted alkyl group having 1 to 5 carbon atoms, or an alkyl group having 1 to 5 carbon atoms that is substituted with a fluorine atom, and * represents a bonding position with C in the general formula (1).

According to one embodiment of the present invention, there is provided a thin-film forming raw material, including the above-mentioned indium compound.

According to one embodiment of the present invention, there is provided a thin-film, which is obtained by using the above-mentioned thin-film forming raw material.

According to one embodiment of the present invention, there is provided a thin-film containing an indium atom, which is formed through use of the above-mentioned thin-film forming raw material by a chemical vapor deposition method.

According to one embodiment of the present invention, there is provided a method of producing a thin-film, including forming a thin-film containing an indium atom on a surface of a substrate through use of a raw material gas obtained by vaporizing the above-mentioned thin-film forming raw material.

In the method of producing a thin-film according to the one embodiment of the present invention, it is preferred that the method include: a step 1 of causing the raw material gas to adsorb to the surface of the substrate to form a precursor thin-film; and a step 2 of causing the precursor thin-film to react with a reactive gas to form the thin-film containing an indium atom on the surface of the substrate.

In the method of producing a thin-film according to the one embodiment of the present invention, it is preferred that the reactive gas be an oxidizing gas, and the thin-film containing an indium atom be indium oxide.

In the method of producing a thin-film according to the one embodiment of the present invention, it is preferred that the oxidizing gas be a gas containing at least one selected from the group consisting of: oxygen; ozone; and water vapor.

In the method of producing a thin-film according to the one embodiment of the present invention, it is preferred that the step 2 be performed in a range of from 150° C. to 400° C.

Advantageous Effects of Invention

According to the present invention, the indium compound, which is excellent in thermal stability, and can produce a high-quality thin-film when used as a thin-film forming raw material, can be provided. In addition, according to the present invention, a high-quality indium-containing thin-film can be formed by a CVD method, in particular, an ALD method.

DESCRIPTION OF EMBODIMENTS

Figure 1:
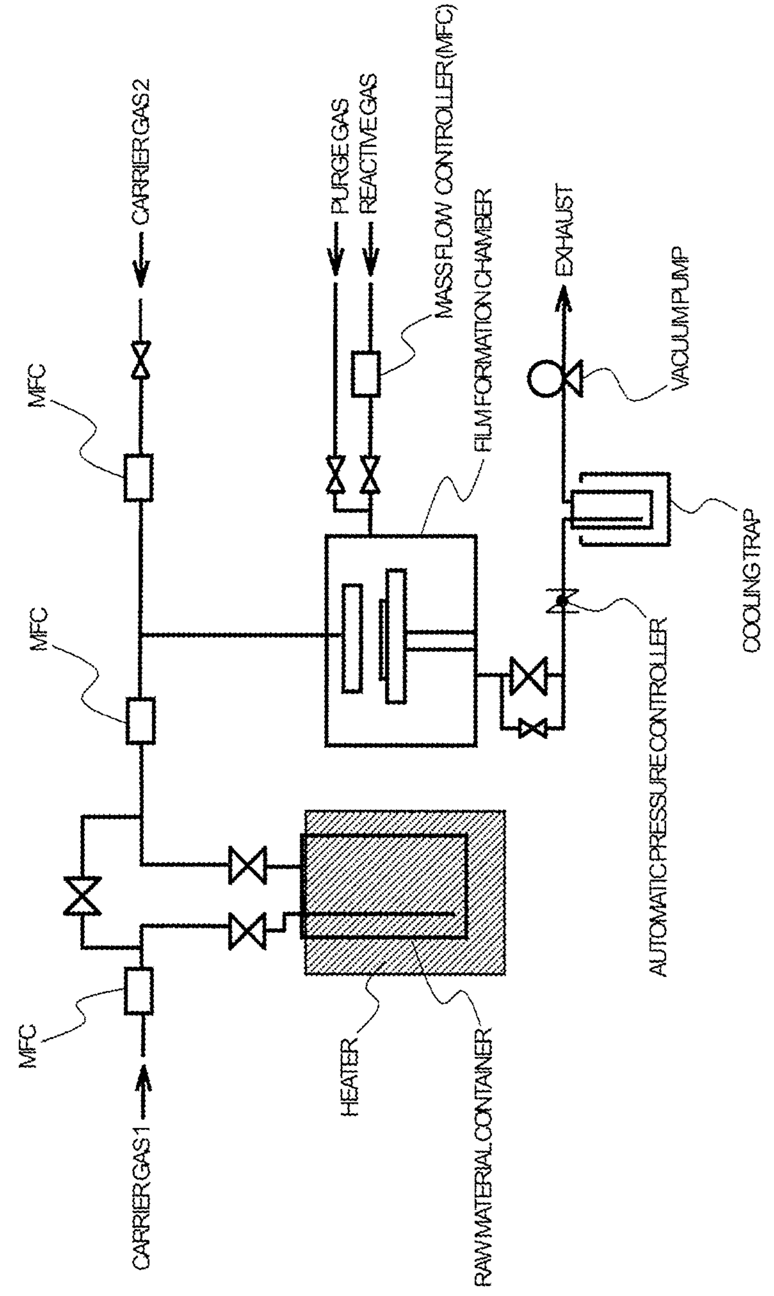
FIG. 1 is a schematic diagram for illustrating an example of an ALD apparatus to be used in a method of producing a thin-film of the present invention.

An indium compound of the present invention, which is represented by the general formula (1), is described.

In the general formula (1), $R^1$ and $R^2$ each independently represent an unsubstituted alkyl group having 1 to 5 carbon atoms, or an alkyl group having 1 to 5 carbon atoms that is substituted with a fluorine atom, $R^3$ and $R^4$ each independently represent a hydrogen atom, a fluorine atom, an unsubstituted alkyl group having 1 to 5 carbon atoms, or an alkyl group having 1 to 5 carbon atoms that is substituted with a fluorine atom, and A represents a group represented by the general formula (L-1) or (L-2).

Examples of the unsubstituted alkyl group having 1 to 5 carbon atoms that is represented by each of $R^1$, $R^2$, $R^3$, $R^4$, $R^{11}$, $R^{12}$, $R^{13}$, $R^{14}$, $R^{21}$, and $R^{22}$ include a methyl group, an ethyl group, a n-propyl group, an isopropyl group, a n-butyl group, a sec-butyl group, a tert-butyl group, an isobutyl group, a n-pentyl group, a sec-pentyl group, a tert-pentyl group, an isopentyl group, and a neopentyl group. In each of those alkyl groups, part or all of hydrogen atoms may be substituted with fluorine atoms. Examples of the alkyl group having 1 to 5 carbon atoms that is substituted with a fluorine atom include a fluoromethyl group, a difluoromethyl group, a trifluoromethyl group, a fluoroethyl group, a difluoroethyl group, a trifluoroethyl group, a pentafluoroethyl group, a fluoropropyl group, a heptafluoropropyl group, a fluoropentyl group, and an undecylfluoropentyl group.

From the viewpoint that vapor is obtained at low temperatures, an indium compound in which both of $R^1$ and $R^2$ each represent an unsubstituted alkyl group having 1 to 3 carbon atoms is preferred, and an indium compound in which both of $R^1$ and $R^2$ represent methyl groups is more preferred.

From the viewpoint that vapor is obtained at low temperatures, an indium compound in which $R^3$ and $R^4$ each represent a hydrogen atom, an unsubstituted alkyl group having 1 to 4 carbon atoms, or an alkyl group having 1 to 4 carbon atoms that is substituted with a fluorine atom is preferred, and an indium compound in which $R^3$ represents an alkyl group having 1 to 4 carbon atoms, and $R^4$ represents a hydrogen atom is more preferred.

The indium compound of the present invention has the following physical properties, and hence may be suitably used as a precursor of a thin-film obtained by a chemical vapor deposition method, such as a CVD method or an ALD method.

The molecular weight of the indium compound of the present invention is preferably from 200 to 400, more preferably from 250 to 350. When the molecular weight of the indium compound falls within the ranges, the compound is excellent in thermal stability, and hence a high-quality indium-containing thin-film having a small residual carbon amount is easily obtained.

The indium compound of the present invention preferably has a melting point of 150° C. or less, and the compound is more preferably a liquid at 25° C. from the viewpoint that the compound becomes easier to handle. Although the lower limit of the melting point is not particularly limited, the melting point is preferably −200° C. or more in consideration of the handleability of the compound.

The thermal decomposition starting temperature of the indium compound of the present invention measured by differential scanning calorimetry (DSC) is preferably 200° C. or more, and the temperature is more preferably 250° C. or more from the viewpoint that the compound is excellent in thermal stability. Although the upper limit of the thermal decomposition starting temperature is not particularly limited, the thermal decomposition starting temperature is preferably 1,500° C. or less.

The temperature of the indium compound of the present invention at the time of its 50 mass % loss in thermogravimetric differential thermal analysis (TG-DTA), which is measured by the TG-DTA, is preferably 200° C. or less, and the temperature is more preferably 185° C. or less from the viewpoint that the vapor property of the compound at the time of its use as a thin-film forming raw material is excellent. Although the lower limit of the temperature at the time of the 50 mass % loss in the TG-DTA is not particularly limited, the temperature at the time of the 50 mass % loss in the TG-DTA is preferably 25° C. or more because when vapor is obtained at 25° C., there is no need to heat the compound at the time of the formation of a thin-film.

Although preferred specific examples of the indium compound represented by the general formula (1) include Compound No. 1 to Compound No. 50 below, the present invention is not limited by these indium compounds. In Compound No. 1 to Compound No. 50 below, the symbol “Me” represents a methyl group, the symbol “Et” represents an ethyl group, the symbol “iPr” represents an isopropyl group, the symbol “tBu” represents a tert-butyl group, and the symbol “$CF_3$” represents a trifluoromethyl group.

No. 1

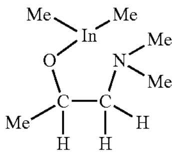

No. 2

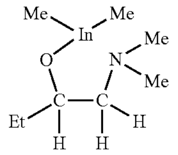

No. 3

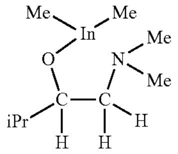

No. 4

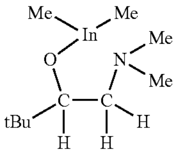

No. 5

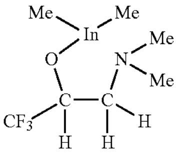

No. 6

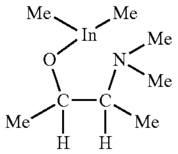

No. 7

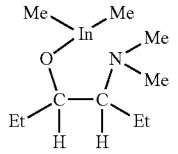

No. 8

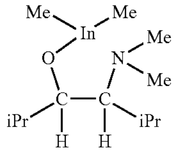

-continued

No. 9

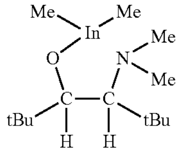

No. 10

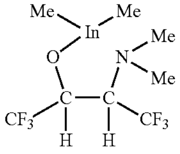

No. 11

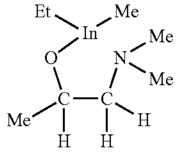

No. 12

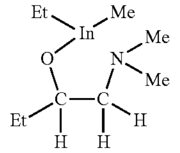

No. 13

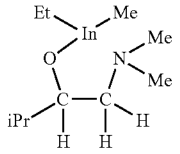

No. 14

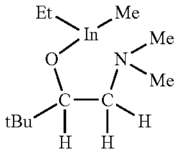

No. 15

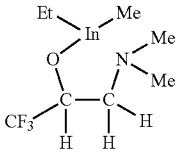

No. 16

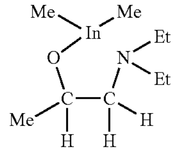

No. 17

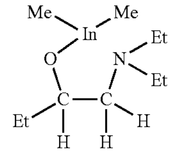

No. 18

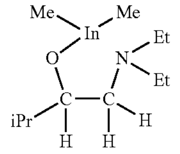

-continued
No. 19
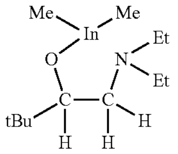
No. 20
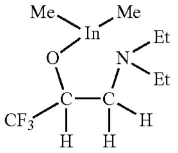
No. 21
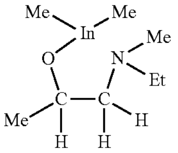
No. 22
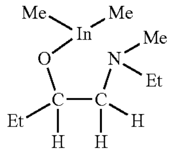
No. 23
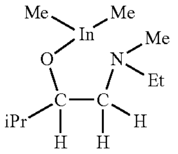
No. 24
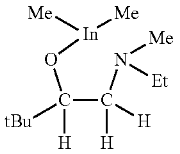
No. 25
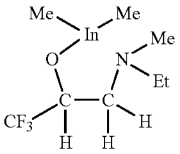
No. 26
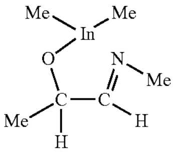
No. 27
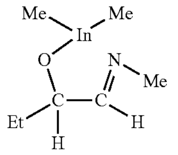
No. 28
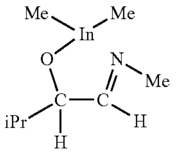
-continued
No. 29
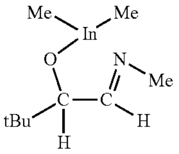
No. 30
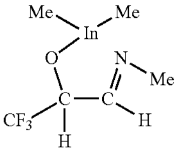
No. 31
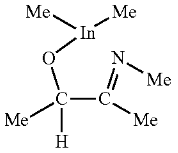
No. 32
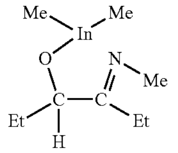
No. 33
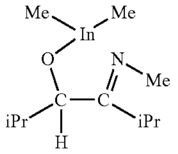
No. 34
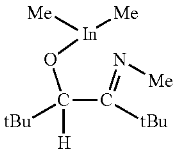
No. 35
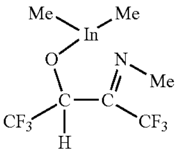
No. 36
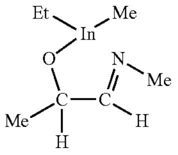
No. 37
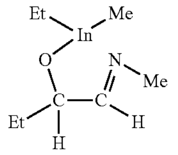
No. 38
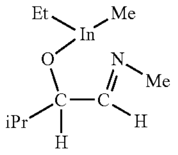

-continued

No. 39

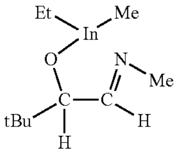

No. 40

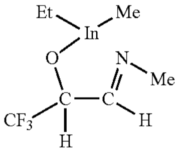

No. 41

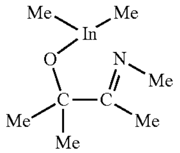

No. 42

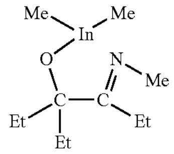

No. 43

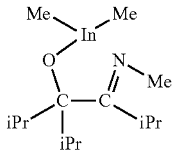

No. 44

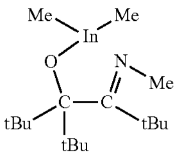

No. 45

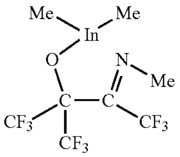

No. 46

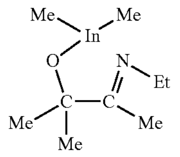

No. 47

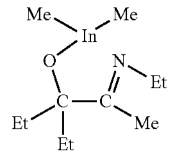

No. 48

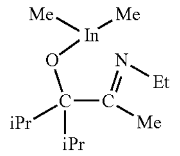

-continued

No. 49

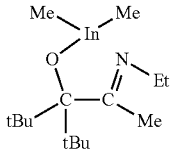

No. 50

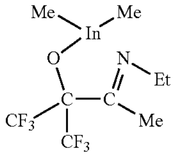

The indium compound of the present invention may be produced by utilizing a known reaction. For example, the following indium compound may be produced by causing trimethylindium and a dialkylamino alcohol to react with each other, evaporating the solvent, and purifying the residue through distillation: in the general formula (1), A represents a group represented by the general formula (L-1), $R^1$, $R^2$, $R^3$, and $R^4$ represent methyl groups, $R^{11}$ and $R^{12}$ represent hydrogen atoms, and $R^{13}$ and $R^{14}$ each independently represent an unsubstituted alkyl group having 1 to 5 carbon atoms.

In addition, the following indium compound may be produced by causing trimethylindium and an alkylimino alcohol to react with each other, evaporating the solvent, and purifying the residue through distillation: in the general formula (1), A represents a group represented by the general formula (L-2), $R^1$, $R^2$, $R^3$, $R^4$, and $R^{21}$ represent methyl groups, and $R^{22}$ represents an unsubstituted alkyl group having 1 to 5 carbon atoms.

Next, a thin-film forming raw material of the present invention is described.

The thin-film forming raw material of the present invention only needs to include the indium compound represented by the general formula (1) as a precursor of a thin-film, and the composition thereof varies depending on the kind of a thin-film to be targeted. For example, when a thin-film containing only indium as a metal is produced, the thin-film forming raw material is free of a metal compound other than an indium atom and a semimetal compound. Meanwhile, when a thin-film containing an indium atom and another metal and/or semimetal is produced, the thin-film forming raw material may include a compound containing the desired metal and/or a compound containing the desired semimetal (hereinafter described as “other precursor”) in addition to the indium compound represented by the general formula (1).

In the case of a multi-component chemical vapor deposition method in which a plurality of precursors are used, there is no particular limitation on the other precursor that may be used together with the indium compound represented by the general formula (1), and a well-known general precursor used for the thin-film forming raw material may be used.

Examples of the other precursor include compounds of: one or two or more selected from the group consisting of compounds used as organic ligands, such as an alcohol compound, a glycol compound, a β-diketone compound, a cyclopentadiene compound, and an organic amine compound; and silicon or a metal. In addition, examples of the kind of the metal in the precursor include lithium, sodium, potassium, magnesium, calcium, strontium, barium, titanium, zirconium, hafnium, vanadium, niobium, tantalum, chromium, molybdenum, tungsten, manganese, iron, osmium, ruthenium, cobalt, rhodium, iridium, nickel, palladium, platinum, copper, silver, gold, zinc, aluminum, gallium, indium, germanium, lead, antimony, bismuth, radium, scandium, ruthenium, yttrium, lanthanum, cerium, praseodymium, neodymium, promethium, samarium, europium, gadolinium, terbium, dysprosium, holmium, erbium, thulium, ytterbium, and lutetium.

Examples of the alcohol compound to be used as the organic ligand in the above-mentioned other precursor include: alkyl alcohols, such as methanol, ethanol, propanol, isopropyl alcohol, butanol, sec-butyl alcohol, isobutyl alcohol, tert-butyl alcohol, pentyl alcohol, isopentyl alcohol, and tert-pentyl alcohol; ether alcohols, such as 2-methoxyethanol, 2-ethoxyethanol, 2-butoxyethanol, 2-(2-methoxyethoxy)ethanol, 2-methoxy-1-methylethanol, 2-methoxy-1,1-dimethylethanol, 2-ethoxy-1,1-dimethylethanol, 2-isopropoxy-1,1-dimethylethanol, 2-butoxy-1,1-dimethylethanol, 2-(2-methoxyethoxy)-1,1-dimethylethanol, 2-propoxy-1,1-diethylethanol, 2-sec-butoxy-1,1-diethylethanol, and 3-methoxy-1,1-dimethylpropanol; and dialkylamino alcohols, such as dimethylaminoethanol, ethylmethylaminoethanol, diethylaminoethanol, dimethylamino-2-pentanol, ethylmethylamino-2-pentanol, dimethylamino-2-methyl-2-pentanol, ethylmethylamino-2-methyl-2-pentanol, and diethylamino-2-methyl-2-pentanol.

Examples of the glycol compound to be used as the organic ligand in the above-mentioned other precursor include 1,2-ethanediol, 1,2-propanediol, 1,3-propanediol, 2,4-hexanediol, 2,2-dimethyl-1,3-propanediol, 2,2-diethyl-1,3-propanediol, 1,3-butanediol, 2,4-butanediol, 2,2-diethyl-1,3-butanediol, 2-ethyl-2-butyl-1,3-propanediol, 2,4-pentanediol, 2-methyl-1,3-propanediol, 2-methyl-2,4-pentanediol, 2,4-hexanediol, and 2,4-dimethyl-2,4-pentanediol.

Examples of the cyclopentadiene compound to be used as the organic ligand in the above-mentioned other precursor include cyclopentadiene, methylcyclopentadiene, ethylcyclopentadiene, propylcyclopentadiene, isopropvicyclopentadiene, butylcvclopentadiene, sec-butylcyclopentadiene, isobutylcyclopentadiene, tert-butylcyclopentadiene, dimethylcyclopentadiene, tetramethylcyclopentadiene, and pentamethylcyclopentadiene.

Examples of the organic amine compound to be used as the organic ligand in the above-mentioned other precursor include methylamine, ethylamine, propylamine, isopropylamine, butylamine, sec-butylamine, tert-butylamine, isobutylamine, dimethylamine, diethylamine, dipropylamine, diisopropylamine, ethylmethylamine, propylmethylamine, and isopropylmethylamine.

The above-mentioned other precursors are known in the art, and production methods therefor are also known. An example of the production methods is given as described below. For example, when the alcohol compound is used as the organic ligand, the precursor may be produced through a reaction between an inorganic salt of the metal described above or a hydrate thereof and an alkali metal alkoxide of the alcohol compound. In this case, examples of the inorganic salt of the metal or the hydrate thereof may include a halide and a nitrate of the metal. Examples of the alkali metal alkoxide may include a sodium alkoxide, a lithium alkoxide, and a potassium alkoxide.

Examples of such a multi-component chemical vapor deposition method as described above include: a method including vaporizing and supplying each component of the thin-film forming raw material independently (hereinafter sometimes described as "single source method"); and a method including vaporizing and supplying a mixed raw material obtained by mixing multi-component raw materials in accordance with desired composition in advance (hereinafter sometimes described as "cocktail source method"). In the case of the single source method, the above-mentioned other precursor is preferably a compound which is similar to the indium compound represented by the general formula (1) in the behavior of thermal decomposition and/or oxidative decomposition. In the case of the cocktail source method, the above-mentioned other precursor is preferably a compound which is similar to the indium compound represented by the general formula (1) in the behavior of thermal decomposition and/or oxidative decomposition, and in addition, which causes no change through a chemical reaction or the like at the time of mixing.

In the case of the cocktail source method in the multi-component chemical vapor deposition method, a mixture of the indium compound represented by the general formula (1) and the other precursor, or a solution obtained by dissolving the mixture in an organic solvent may be used as the thin-film forming raw material.

There is no particular limitation on the above-mentioned organic solvent, and a well-known general organic solvent may be used. Examples of the organic solvent include: acetic acid esters, such as ethyl acetate, butyl acetate, and methoxyethyl acetate; ethers, such as tetrahydrofuran, tetrahydropyran, ethylene glycol dimethyl ether, diethylene glycol dimethyl ether, triethylene glycol dimethyl ether, dibutyl ether, and dioxane; ketones, such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons, such as hexane, cyclohexane, methylcyclohexane, dimethylcyclohexane, ethylcyclohexane, heptane, octane, toluene, and xylene; hydrocarbons each having a cyano group, such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; and pyridine and lutidine. Those organic solvents may be used alone or as a mixture thereof depending on the solubility of a solute, the relationship among the use temperature, boiling point, and flash point of the solvent, and the like.

When the thin-film forming raw material of the present invention includes the above-mentioned organic solvent, the total precursor amount in the thin-film forming raw material is preferably adjusted to from 0.01 mol/liter to 2.0 mol/liter, and is more preferably adjusted to from 0.05 mol/liter to 1.0 mol/liter.

Herein, when the thin-film forming raw material is free of the metal compound other than indium and the semimetal compound, the total precursor amount represents the amount of the indium compound represented by the general formula (1). When the thin-film forming raw material includes the other precursor in addition to the indium compound represented by the general formula (1), the total precursor amount represents the total amount of the indium compound represented by the general formula (1) and the other precursor.

In addition, the thin-film forming raw material of the present invention may include a nucleophilic reagent as required in order to improve the stability of each of the indium compound represented by the general formula (1) and the other precursor. Examples of the nucleophilic reagent include: ethylene glycol ethers, such as glyme, diglyme, triglyme, and tetraglyme; crown ethers, such as 18-crown-6, dicyclohexyl-18-crown-6,24-crown-8, dicyclohexyl-24-crown-8, and dibenzo-24-crown-8; polyamines, such as ethylenediamine, N,N'-tetramethylethylenediamine, diethylenetriamine, triethylenetetramine, tetraethylenepentamine, pentaethylenehexamine, 1,1,4,7,7-pentamethyldiethylenetriamine, 1,1,4,7,10,10-hexamethyltriethylenetetramine, and triethoxytriethyleneamine; cyclic polyamines, such as cyclam and cyclen; heterocyclic compounds, such as pyridine, pyrrolidine, piperidine, morpholine, N-methylpyrrolidine, N-methylpiperidine, N-methylmorpholine, tetrahydrofuran, tetrahydropyran, 1,4-dioxane, oxazole, thiazole, and oxathiolane; β-keto esters, such as methyl acetoacetate, ethyl acetoacetate, and 2-methoxyethyl acetoacetate; and β-diketones, such as acetylacetone, 2,4-hexanedione, 2,4-heptanedione, 3,5-heptanedione, and dipivaloylmethane. From the viewpoint that the control of the stability becomes easy, the usage amount of such nucleophilic reagent falls within the range of preferably from 0.1 mol to 10 mol, more preferably from 1 mol to 4 mol with respect to 1 mol of the total precursor amount.

The thin-film forming raw material is desirably prevented from including impurity metal elements other than the components forming the raw material, impurity halogens such as impurity chlorine, and impurity organic substances to the extent possible. The content of each of the impurity metal elements is preferably 100 ppb or less, more preferably 10 ppb or less, and the total content thereof is preferably 1 ppm or less, more preferably 100 ppb or less. In particular, when the raw material is used as a gate insulating film, a gate film, or a barrier layer of an LSI, it is required to reduce the contents of alkali metal elements and alkaline-earth metal elements that influence the electrical characteristics of a thin-film to be obtained. The content of the impurity halogens is preferably 100 ppm or less, more preferably 10 ppm or less, still more preferably 1 ppm or less. The total content of the impurity organic substances is preferably 500 ppm or less, more preferably 50 ppm or less, still more preferably 10 ppm or less. In addition, moisture causes generation of particles in the thin-film forming raw material and generation of particles during thin-film formation, and hence it is better to remove moisture in the precursor, the organic solvent, and the nucleophilic reagent as much as possible in advance at the time of use in order to reduce moisture in each of the precursor, the organic solvent, and the nucleophilic reagent. The moisture content of each of the precursor, the organic solvent, and the nucleophilic reagent is preferably 10 ppm or less, more preferably 1 ppm or less.

In addition, it is preferred that the thin-film forming raw material be prevented from including particles to the extent possible in order to reduce or prevent particle contamination of a thin-film to be formed. Specifically, in particle measurement with a light scattering liquid particle detector in the thin-film forming raw material, it is preferred that the number of particles larger than 0.3 μm be 100 or less in 1 mL of the thin-film forming raw material, and it is more preferred that the number of particles larger than 0.2 μm be 100 or less in 1 ml of the thin-film forming raw material.

The form of the thin-film forming raw material of the present invention is appropriately selected in accordance with an approach such as a transportation and supply method for a chemical vapor deposition method to be used, such as a CVD method or an ALD method.

As the above-mentioned transportation and supply method, there are given a "gas transportation method" and a "liquid transportation method." The gas transportation method includes: vaporizing the thin-film forming raw material of the present invention in a container in which the raw material is stored (hereinafter described as "raw material container") through heating and/or decompression to provide a raw material gas; and introducing the raw material gas into a film formation chamber having set therein a substrate together with a carrier gas, such as argon, nitrogen, or helium, as required. The liquid transportation method includes: transporting the thin-film forming raw material to a vaporization chamber under a state of a liquid; vaporizing the raw material in the vaporization chamber through heating and/or decompression to provide a raw material gas; and introducing the raw material gas into a film formation chamber.

In the case of the gas transportation method, the very indium compound of the present invention may be used as the thin-film forming raw material. In the case of the liquid transportation method, the very indium compound of the present invention or a solution obtained by dissolving the indium compound in an organic solvent may be used as the thin-film forming raw material. The thin-film forming raw material of the present invention may further include, for example, the other precursor or the nucleophilic reagent described above.

Next, a method of producing a thin-film including using the thin-film forming raw material of the present invention is described.

The method of producing a thin-film of the present invention includes forming a thin-film containing an indium atom on a surface of a substrate through use of a raw material gas obtained by vaporizing the above-mentioned thin-film forming raw material.

The step of vaporizing the thin-film forming raw material of the present invention to provide the raw material gas may be performed in a raw material container, or may be performed in a vaporization chamber. In each case, the thin-film forming raw material of the present invention is preferably evaporated at from 0° C. to 200° C. In addition, a pressure in the raw material container and a pressure in the vaporization chamber when the thin-film forming raw material is vaporized in the raw material container or in the vaporization chamber to provide the raw material gas are each preferably from 1 Pa to 10,000 Pa.

A method of forming the thin-film containing an indium atom on the surface of the substrate through use of the raw material gas is, for example, a method including thermally decomposing the raw material gas, or a method including utilizing the chemical reaction of the raw material gas.

With regard to the method including thermally decomposing the raw material gas to form the thin-film containing an indium atom on the surface of the substrate, the thin-film containing an indium atom may be formed by, for example, heating the substrate or the inside of a film formation chamber having set therein the substrate to a temperature of about 100° C. or more to thermally decompose the raw material gas, and causing the thermally decomposed product to adsorb to and deposit on the substrate. As the thermal decomposition reaction is performed at higher temperatures, a thin-film containing a smaller amount of impurities is obtained, but damage to the substrate due to the high temperatures becomes larger. Accordingly, the thermal decomposition is preferably performed at from 230° C. to 1,000° C., and the thermal decomposition is more preferably performed at from 250° C. to 500° C.

With regard to the method including utilizing the chemical reaction of the raw material gas to form the thin-film containing an indium atom on the surface of the substrate, the thin-film containing an indium atom may be formed by utilizing a vapor phase reaction between the precursor in the raw material gas and a reactive gas, or a surface reaction between the precursor in the raw material gas and the surface of the substrate.

In addition, an oxide, a nitride, a metal film, or the like may be formed by appropriately selecting the kind of the reactive gas to be caused to react with the raw material gas. Examples of the reactive gas to be caused to react with the raw material gas include: oxidizing gases, including oxygen, ozone, nitrogen dioxide, nitrogen monoxide, water vapor, hydrogen peroxide, formic acid, acetic acid, and acetic anhydride; reducing gases, including hydrogen; and nitriding gases, including organic amine compounds, such as a monoalkylamine, a dialkylamine, a trialkylamine, and an alkylenediamine, hydrazine, and ammonia. Those reactive gases may be used alone or as a mixture thereof. The thin-film forming raw material of the present invention can react with an oxidizing gas out of those gases at specifically low temperatures. From the viewpoint that a film thickness to be obtained per cycle is large, and hence the thin-film can be produced with high productivity, a gas containing at least one selected from the group consisting of: oxygen; ozone; and water vapor is preferably used as the reactive gas, and a gas containing hydrogen or water vapor is more preferably used.

To accelerate the formation of the thin-film, the method of producing a thin-film of the present invention may be performed by exciting the substrate or the raw material gas through utilization of a thermal reaction, plasma, and a photoreaction.

A method of exciting the substrate or the raw material gas through utilization of the thermal reaction is, for example, a method including heating the substrate, or heating the inside of the film formation chamber having set therein the substrate, to a predetermined film formation temperature to excite the raw material gas and/or the substrate. A heater for the heating may be set outside the film formation chamber, or the heater may be set in the film formation chamber to heat only the substrate and vicinities thereof.

A method of exciting the substrate or the raw material gas through utilization of the plasma is, for example, a method including: heating the substrate to the predetermined film formation temperature in advance under a state in which the raw material gas is introduced into the film formation chamber; and generating the plasma in the chamber to excite the raw material gas and/or the substrate. A mechanism for the plasma generation is, for example, a method including applying a high-frequency wave to a high-frequency coil set outside a vacuum container to generate the plasma.

A method of exciting the substrate or the raw material gas through utilization of the photoreaction is, for example, a method including exciting the raw material gas and the surface of the substrate through use of a UV lamp (e.g., a low-pressure mercury lamp). Film damage due to charged particles can be suppressed as compared to the method of producing a thin-film including utilizing the plasma.

In the method of producing a thin-film of the present invention, as a material for the substrate to be set in the film formation chamber, there are given, for example: silicon; ceramics, such as silicon nitride, titanium nitride, tantalum nitride, titanium oxide, ruthenium oxide, zirconium oxide, hafnium oxide, and lanthanum oxide; glass; and metals, such as metal cobalt and metal ruthenium. The shape of the substrate is, for example, a plate shape, a spherical shape, a fibrous shape, or a scaly shape. The surface of the substrate may be planar, or may have a three-dimensional structure such as a trench structure.

In addition, the method of producing a thin-film of the present invention may include: a step 1 of causing the raw material gas, which is obtained by vaporizing the thin-film forming raw material, to adsorb to the surface of the substrate to form a precursor thin-film; and a step 2 of causing the precursor thin-film to react with a reactive gas to form the thin-film containing an indium atom on the surface of the substrate.

The step 1 is a step of vaporizing the thin-film forming raw material through heating and/or decompression to provide the raw material gas containing the indium compound, followed by the introduction of the raw material gas into the film formation chamber having set therein the substrate to form the precursor thin-film on the surface of the substrate.

A method of introducing the raw material gas into the film formation chamber having set therein the substrate is, for example, the above-mentioned gas transportation method, liquid transportation method, single source method, or cocktail source method.

Examples of the reactive gas to be caused to react with the precursor thin-film in the step 2 include the same examples as those of the above-mentioned reactive gas.

The method of producing a thin-film of the present invention preferably includes an evacuation step of evacuating the raw material gas that is unreacted after the step 1 of forming the precursor thin-film because a high-quality thin-film is easily obtained. In addition, the method of producing a thin-film of the present invention preferably includes an evacuation step of evacuating a by-product gas, which has been produced at the time of the reaction of the precursor thin-film with the reactive gas, and the reactive gas that is unreacted after the step 2 of forming the thin-film containing an indium atom on the surface of the substrate because a high-quality thin-film is easily obtained.

The CVD method or the ALD method is preferably adopted as the method of producing a thin-film of the present invention because a high-quality thin-film is easily obtained, and the ALD method is more preferably adopted from the viewpoints that the method is excellent in composition controllability and step coverage, and that the method enables hybrid integration.

Examples of the CVD method include: a thermal CVD method; a plasma-enhanced CVD (PECVD) method; a pulsed CVD (PCVD) method; a low-pressure CVD (LPCVD) method; a semi-atmospheric pressure CVD (SACVD) method; an atmospheric pressure CVD (APCVD) method; a hot-wire CVD (HWCVD) method; a radicals incorporated CVD method; and a combination thereof.

Examples of the ALD method include: a thermal ALD method; a plasma-enhanced ALD (PEALD) method; a spatially separated ALD (S-ALD) method; a hot-wire ALD (HWALD) method; a radicals incorporated ALD method; a selective area ALD (SA-ALD) method; and a combination thereof.

Although production conditions in the method of producing a thin-film of the present invention are not particularly limited, for example, a reaction temperature (substrate temperature) and a reaction pressure may be appropriately determined in accordance with the desired thickness of the thin-film and the kind thereof. The reaction temperature is preferably 100° C. or more, which is a temperature at which the thin-film forming raw material of the present invention sufficiently undergoes a reaction, and the temperature more preferably falls within the range of from 150° C. to 400° C. When a thin-film is produced through use of the thin-film forming raw material of the present invention by the ALD method, the raw material is preferably used in an ALD window adapted to the reactive gas.

Next, a method of producing a thin-film containing an indium atom (hereinafter sometimes described as "indium-containing thin-film") by the ALD method is described as an embodiment of the method of producing a thin-film of the present invention.

Figure 2:
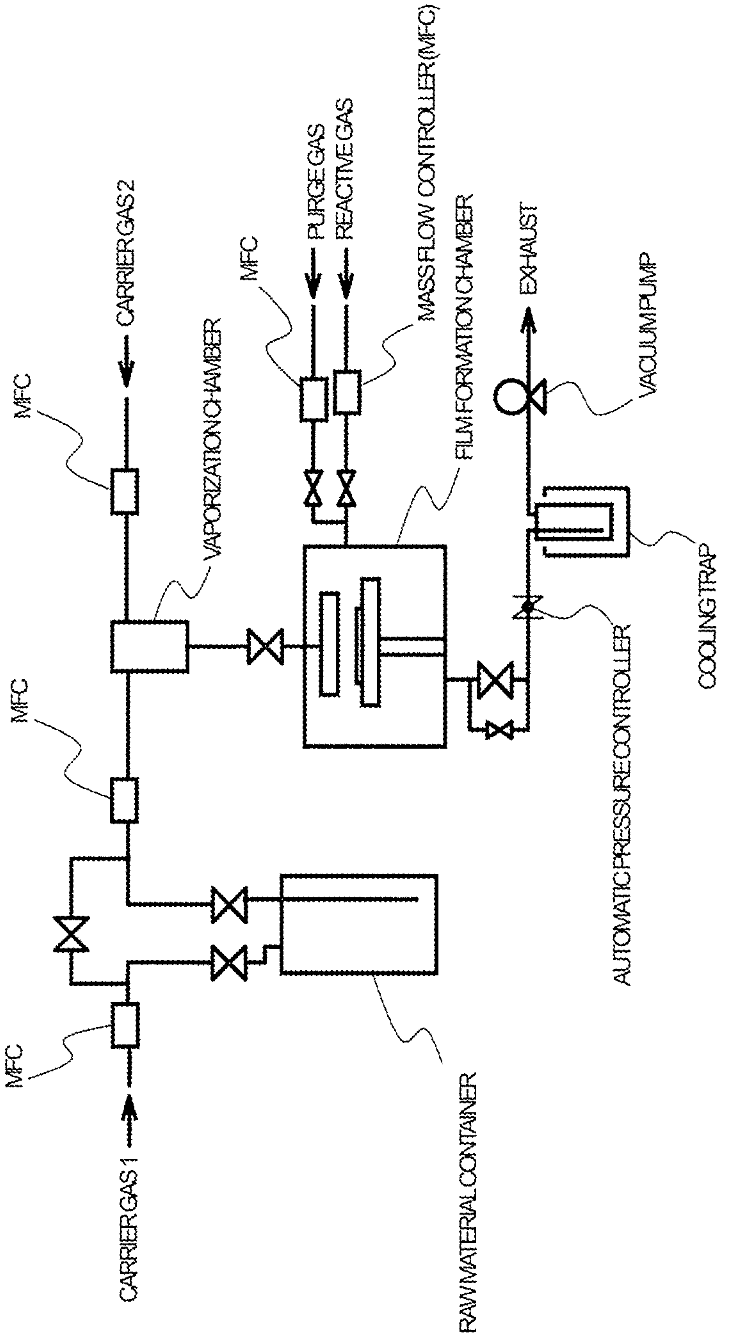
FIG. 2 is a schematic diagram for illustrating another example of the ALD apparatus to be used in the method of producing a thin-film of the present invention.

Specific examples of an ALD apparatus to be used in the method of producing a thin-film of the present invention include: such an apparatus as illustrated in FIG. 1 capable of vaporizing the thin-film forming raw material in a raw material container through heating and/or decompression to provide a raw material gas, and supplying the raw material gas to a film formation chamber together with a carrier gas as required; and such an apparatus as illustrated in FIG. 2 capable of transporting the thin-film forming raw material under the state of a liquid to a vaporization chamber, vaporizing the raw material in the vaporization chamber through heating and/or decompression to provide a raw material gas, and supplying the raw material gas to a film formation chamber. The apparatus is not limited to such a single-substrate type apparatus including a film formation chamber as illustrated in each of FIG. 1 and FIG. 2, and an apparatus capable of simultaneously processing a large number of substrates through use of a batch furnace may also be used.

The method of producing a thin-film of the present invention includes: a step of introducing the raw material gas obtained by vaporizing the thin-film forming raw material into the film formation chamber having set therein the substrate (raw material gas introduction step); the step 1 of causing the raw material gas to adsorb to the surface of the substrate to form a precursor thin-film (precursor thin-film formation step); and a step of introducing a reactive gas into the film formation chamber, followed by a reaction of the precursor thin-film with the reactive gas to form an indium-containing thin-film on the surface of the substrate (indium-containing thin-film formation step). In addition, the method preferably includes a step of evacuating the gas in the film formation chamber (evacuation step) between the precursor thin-film formation step and the indium-containing thin-film formation step, and after the indium-containing thin-film formation step. In the method of producing a thin-film of the present invention, the raw material gas introduction step, the precursor thin-film formation step, the evacuation step, the indium-containing thin-film formation step, and the other evacuation step are sequentially performed as one cycle, and the thickness of the indium-containing thin-film can be adjusted by repeating the cycle. The respective steps of the method of producing a thin-film of the present invention are described below.

(Raw Material Gas Introduction Step)

The raw material gas introduction step is a step of introducing a raw material gas, which is obtained by vaporizing the thin-film forming raw material, into a film formation chamber having set therein a substrate. As a method of introducing the raw material gas obtained by vaporizing the thin-film forming raw material into the film formation chamber having set therein the substrate, there are given: a gas transportation method including vaporizing the thin-film forming raw material in a container in which the raw material is stored (hereinafter referred to as "raw material container") through heating and/or decompression to provide a raw material gas, and introducing the raw material gas into the film formation chamber having set therein the substrate together with a carrier gas, such as argon, nitrogen, or helium, as required as illustrated in each of FIG. 1 and FIG. 3; and a liquid transportation method including transporting the thin-film forming raw material under the state of a liquid to a vaporization chamber, vaporizing the thin-film forming raw material in the vaporization chamber through heating and/or decompression to provide a raw material gas, and introducing the raw material gas into the film formation chamber having set therein the substrate as illustrated in each of FIG. 2 and FIG. 4. In the case of the gas transportation method, the very indium compound represented by the general formula (1) may be used as the thin-film forming raw material. In the case of the liquid transportation method, the very indium compound represented by the general formula (1) or a solution obtained by dissolving the indium compound in an organic solvent may be used as the thin-film forming raw material. Such thin-film forming raw material may further contain a nucleophilic reagent or the like.

In addition, as a method to be used in the raw material gas introduction step other than the gas transportation method and the liquid transportation method, there are given such a single source method and a cocktail source method as described above each serving as a multi-component ALD method including a plurality of precursors. Regardless of which introduction method is used, from the viewpoint of handleability, the thin-film forming raw material is preferably vaporized in the range of from 0° C. to 200° C. In addition, when the thin-film forming raw material is vaporized to provide the raw material gas in the raw material container or in the vaporization chamber, from the viewpoint that the thin-film forming raw material is easily vaporized, a pressure in the raw material container and a pressure in the vaporization chamber are each preferably from 1 Pa to 10,000 Pa.

(Precursor Thin-film Formation Step)

After the raw material gas has been introduced into the film formation chamber, the precursor thin-film can be formed on the surface of the substrate by causing the raw material gas to adsorb to the surface of the substrate. At this time, the substrate may be heated, or an inside of the film formation chamber may be heated. Conditions at the time of the formation of the precursor thin-film are not particularly limited, and for example, an adsorption temperature (substrate temperature), a system pressure, or the like may be appropriately determined depending on the kind of the thin-film forming raw material. The precursor thin-film formation step is preferably performed under a state in which the substrate is heated to 100° C. or more. From the viewpoint that a uniform precursor thin-film is easily obtained, the step is more preferably performed under a state in which the substrate is heated to from 150° C. to 400° C. The system pressure is not particularly limited, but is preferably from 1 Pa to 10,000 Pa. From the viewpoint that a uniform precursor thin-film is easily obtained, the system pressure is more preferably from 10 Pa to 1,000 Pa.

(Evacuation Step)

The evacuation step between the precursor thin-film formation step and the indium-containing thin-film formation step is a step of evacuating the raw material gas that has not adsorbed to the surface of the substrate from the film formation chamber after the formation of the precursor thin-film. In this step, it is ideal that the raw material gas not having adsorbed be completely evacuated from the film formation chamber, but it is not always required that the gas be completely evacuated. As an evacuation method, there are given, for example, a method including purging the system of the film formation chamber with an inert gas, such as helium, nitrogen, or argon, a method including performing evacuation by decompressing the system, and a combination of these methods. A decompression degree when decompression is performed preferably falls within the range of from 0.01 Pa to 300 Pa, and from the viewpoint that the evacuation of the raw material gas not having adsorbed is promoted, the decompression degree more preferably falls within the range of from 0.01 Pa to 100 Pa.

(Indium-Containing Thin-film Formation Step)

The indium-containing thin-film formation step is a step of introducing a reactive gas into the film formation chamber to cause the precursor thin-film, that is, the indium compound represented by the general formula (1), which has been adsorbed to the surface of the substrate, to react with the reactive gas through the action of the reactive gas and the action of heat, to thereby form an indium-containing thin-film.

The temperature (substrate temperature) when the precursor thin-film is caused to react with the reactive gas is preferably 150° C. or more, more preferably from 150° C. to 400° C., and from the viewpoint that a high-quality indium-containing thin-film having a smaller residual carbon amount is obtained, the temperature is still more preferably from 200° C. to 350° C. In addition, a pressure in the film formation chamber when this step is performed is preferably from 1 Pa to 10,000 Pa, and from the viewpoint that the reaction between the precursor thin-film and the reactive gas becomes satisfactory, the pressure is more preferably from 10 Pa to 1,000 Pa. The thin-film forming raw material of the present invention can produce a high-quality indium-containing thin-film having a small residual carbon amount with high productivity because its reactivity with the reactive gas is satisfactory.

The reactive gas refers to the same gas as that described above. The reactive gases may be used alone or as a mixture thereof. The thin-film forming raw material of the present invention has such a property as to react with an oxidizing gas at specifically low temperatures, and in particular, the gas reacts with ozone and water vapor at low temperatures. From the viewpoint that a film thickness to be obtained per cycle is large, and hence the thin-film can be produced with high productivity, a gas containing ozone or water vapor is preferred as the reactive gas, and a gas containing water vapor is more preferred.

(Evacuation Step)

The evacuation step after the indium-containing thin-film formation step is a step of evacuating the reactive gas that is unreacted and a by-product gas from the film formation chamber after the indium-containing thin-film formation step for producing an indium-containing thin-film having higher quality. In this step, it is ideal that the reactive gas and the by-product gas be completely evacuated from the film formation chamber, but it is not always required that the gases be completely evacuated. An evacuation method and a decompression degree when decompression is performed are the same as those of the evacuation step between the precursor thin-film formation step and the indium-containing thin-film formation step described above.

Figure 3:
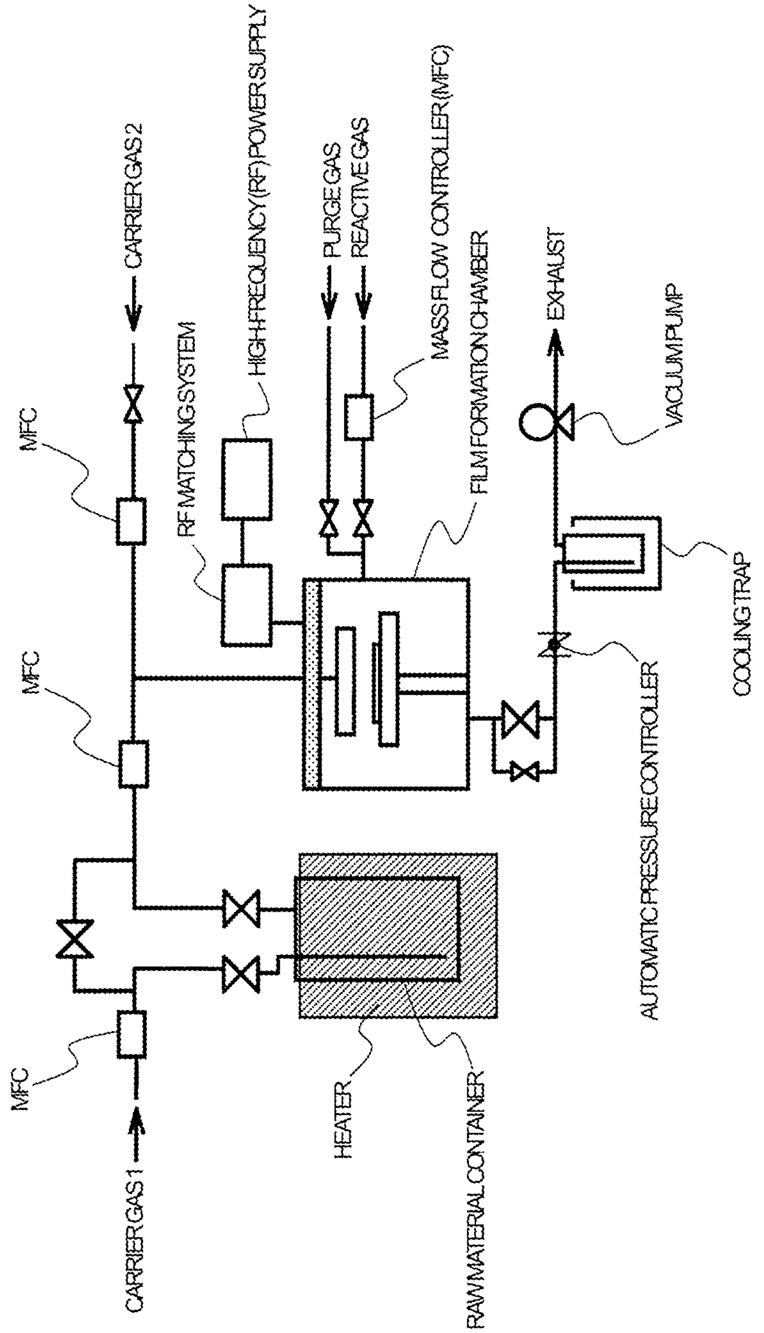
FIG. 3 is a schematic diagram for illustrating still another example of the ALD apparatus to be used in the method of producing a thin-film of the present invention.
Figure 4:
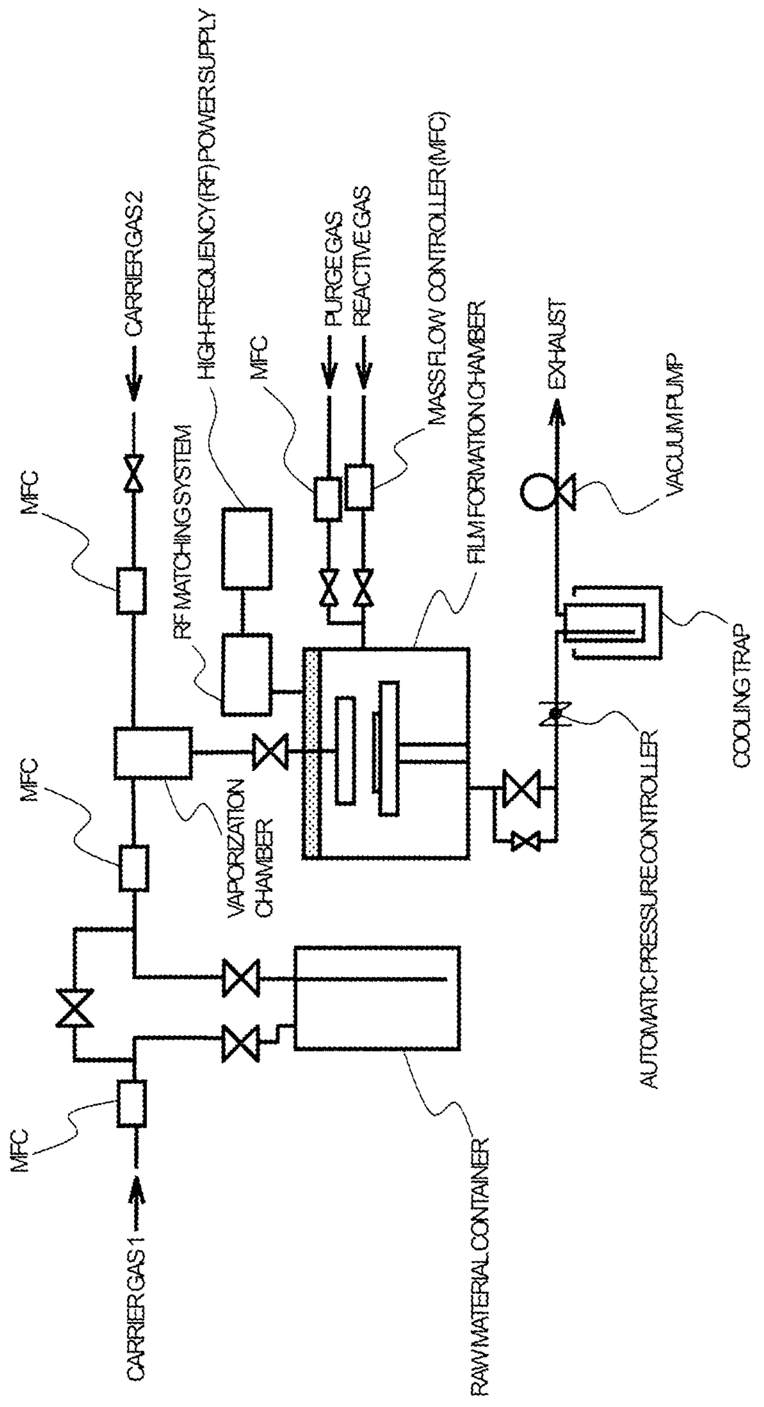
FIG. 4 is a schematic diagram for illustrating still another example of the ALD apparatus to be used in the method of producing a thin-film of the present invention.

In addition, in the method of producing a thin-film of the present invention, energy, such as plasma, light, or a voltage, may be applied in the film formation chamber as illustrated in each of FIG. 3 and FIG. 4, or a catalyst may be used therein. The timing at which the energy is applied and the timing at which the catalyst is used are not particularly limited. The energy may be applied or the catalyst may be used, for example, at the time of the introduction of the raw material gas into the film formation chamber, at the time of the heating in forming the precursor thin-film, at the time of the introduction of the reactive gas into the film formation chamber, at the time of the reaction of the reactive gas with the precursor thin-film, or at the time of the evacuation of the system in the evacuation step, or between the above-mentioned respective steps.

In addition, in the method of producing a thin-film of the present invention, after the formation of the indium-containing thin-film, annealing treatment may be performed under an inert atmosphere, under an oxidizing atmosphere, or under a reducing atmosphere in order that more satisfactory electrical characteristics may be obtained. When step embedding is required, a reflow step may be provided. A temperature in this case is preferably from 200° C. to 1,000° C., and from the viewpoint that damage to the thin-film or the substrate caused by heat can be suppressed, the temperature is more preferably from 250° C. to 500° C.

A thin-film produced through use of the thin-film forming raw material of the present invention may be coated with a substrate made of a metal, oxide ceramics, nitride ceramics, or glass, by appropriately selecting the other precursor, the reactive gas, and the production conditions. The thin-film of the present invention is excellent in various electrical characteristics and optical characteristics, and is hence suitable for the production of electrode materials for memory elements such as DRAM elements, resistance films, diamagnetic films used in recording layers of hard disks, and catalyst materials for polymer electrolyte fuel cells.

EXAMPLES

Now, the present invention is described in more detail by way of Examples. However, the present invention is not limited by the following Examples and the like.

Example 1

Synthesis of Compound No. 4

1.10 Grams (6.9 mmol) of trimethylindium and 15 mL of dehydrated THF were loaded into a 100-milliliter three-necked flask at room temperature, and 1.00 g (6.9 mmol) of 1-dimethylamino-3,3-dimethylbutan-2-ol was dropped into the flask under ice cooling, followed by stirring at room temperature for 17 hours. THF was evaporated in an oil bath at 70° C. under slightly reduced pressure. After that, an opaque liquid remaining in the flask was distilled under reduced pressure (40 Pa) to provide 0.77 g (2.7 mmol, yield: 39%) of an opaque liquid as a distillate.

The resultant opaque liquid was analyzed by $^1$H-NMR and ICP-AES. As a result, the liquid was identified as Compound No. 4. The analysis results of the resultant liquid are described below. In addition, the liquid was evaluated for a temperature (° C.) at the time of its 50 mass % loss in TG-DTA with a TG-DTA by the following method.

(1) $^1$H-NMR (Deuterated Benzene)

−0.055 ppm (6H, singlet), 0.981 ppm (9H, singlet), 1.760-1.797 ppm (1H, double doublet), 1.861 ppm (6H, singlet), 2.270-2.328 ppm (1H, triplet), 3.430-3.468 ppm (1H, double doublet)

(2) Results of Elemental Analysis by ICP-AES

In: 39.75 mass % (theoretical value: 39.71 mass %), C: 41.50 mass % (theoretical value: 41.54 mass %), H: 8.40 mass % (theoretical value: 8.37 mass %), N: 4.83 mass % (theoretical value: 4.84 mass %), O: 5.52 mass % (theoretical value: 5.53 mass %)

(3) Temperature (° C.) at Time of 50 Mass % Loss in Reduced-pressure TG-DTA

A temperature (° C.) when the mass of the test compound reduced by 50 mass % was measured with the TG-DTA at 10 Torr, an argon flow rate of 100 mL/min, and a temperature increase rate of 10° C./min in the scanning temperature range of from 30° C. to 600° C. As a result, the temperature was 158° C. A lower temperature (° C.) at the time of a 50 mass % loss in reduced-pressure TG-DTA means that vapor is obtained at lower temperatures.

Example 2

Synthesis of Compound No. 47

1.06 Grams (6.6 mmol) of trimethylindium and 15 mL of dehydrated THE were loaded into a 100-milliliter three-necked flask at room temperature, and 1.04 g (6.6 mmol) of 3-ethyl-2-ethyliminopentan-3-ol was dropped into the flask under ice cooling, followed by stirring at room temperature for 18 hours. THE was evaporated in an oil bath at 70° C. under slightly reduced pressure. After that, a white solid remaining in the flask was distilled under reduced pressure (40 Pa) to provide 1.65 g (5.5 mmol, yield: 83%) of a white solid as a distillate.

The resultant white solid was analyzed by $^{1}$H-NMR and ICP-AES. As a result, the liquid was identified as Compound No. 47. The analysis results of the resultant white solid are described below. In addition, the liquid was evaluated for a temperature (° C.) at the time of its 50 mass % loss in TG-DTA with a TG-DTA in the same manner as described above.

(1) $^{1}$H-NMR (Deuterated Benzene)

0.084 ppm (6H, singlet), 0.842-0.878 ppm (6H, triplet), 0.942-0.979 ppm (3H, triplet), 1.168 ppm (3H, singlet), 1.499-1.589 ppm (2H, multiplet), 1.784-1.856 ppm (1H, multiplet), 2.933-2.988 (2H, quartet)

(2) Results of Elemental Analysis by ICP-AES

In: 38.12 mass % (theoretical value: 38.13 mass %), C: 43.83 mass % (theoretical value: 43.87 mass %), H: 8.07 mass % (theoretical value: 8.03 mass %), N: 4.68 mass % (theoretical value: 4.65 mass %), O: 5.30 mass % (theoretical value: 5.31 mass %)

(3) Temperature (° C.) at Time of 50 Mass % Loss in Reduced-pressure TG-DTA

A temperature (° C.) when the mass of the test compound reduced by 50 mass % was measured with the TG-DTA at 10 Torr, an argon flow rate of 100 mL/min, and a temperature increase rate of 10° C./min in the scanning temperature range of from 30° C. to 600° C. As a result, the temperature was 183° C.

The following evaluations were performed by using Compounds No. 4 and No. 47 obtained in Examples 1 and 2 described above. In addition, for comparison to the indium compound of the present invention, the following evaluations were performed by using trimethylindium as Comparative Compound 1.

(1) Melting Point Evaluation

The state of each of the compounds at normal pressure and 25° C. was visually observed, and the melting point of a solid compound was measured with a micro melting point-measuring device. Those results are shown in Table 1.

(2) Thermal Decomposition Starting Temperature

In a DSC chart measured with a differential scanning calorimeter DSC at a temperature increase rate of 10° C./min in the scanning temperature range of from 70° C. to 500° C., the temperature at which an exothermic reaction became a peak top was defined as a "thermal decomposition starting temperature (° C.)." Those results are shown in Table 1.

TABLE 1

| | Compound | Melting point evaluation | Thermal decomposition starting temperature |
|---|---|---|---|
| Example 1 | Compound No. 4 | Liquid | 299° C. |
| Example 2 | Compound No. 47 | 116° C. | 297° C. |
| Comparative Example 1 | Comparative Compound 1 | 88° C. | 172° C. |

It was recognized from Table 1 that Comparative Compound 1 having a structure different from that of the indium compound of the present invention was poor in thermal stability. Meanwhile, it was recognized that the indium compound of the present invention had a thermal decomposition starting temperature of more than 250° C., and hence had excellent thermal stability. In addition, as a result of the analysis of the indium compound of the present invention, it was recognized that the compound had a temperature at the time of a 50 mass % loss in reduced-pressure TG-DTA of less than 185° C., and was hence excellent in vapor property. Those results suggest that the indium compound of the present invention is useful as a thin-film forming raw material.

Next, a thin-film was produced through use of the indium compound of the present invention as a thin-film forming raw material.

Example 3

Production of Indium-Containing Thin-Film by ALD Method

An indium-containing thin-film was produced on a silicon substrate by using Compound No. 4 as a thin-film forming raw material and by using the ALD apparatus of FIG. 1 under the following conditions. The composition of the thin-film was analyzed by using X-ray photoelectron spectroscopy. As a result, the thin-film was a thin-film containing an indium oxide, and its residual carbon amount was less than 0.1 atm % that was a detection limit. The film thickness of the thin-film was measured by an X-ray reflectivity method. As a result, the film thickness was 12 nm, and hence a film thickness obtained per cycle was about 0.024 nm.

(Conditions)

Substrate: Silicon substrate

Reaction temperature (substrate temperature): 250° C.

Reactive gas: Water vapor (Steps)

A series of steps including the following (1) to (4) was defined as one cycle, and the cycle was repeated 500 times.

(1) Vapor (raw material gas) of the thin-film forming raw material obtained by vaporization under the conditions of a raw material container heating temperature of 130° C. and a raw material container internal pressure of 100 Pa is introduced into a film formation chamber, and the raw material gas is caused to adsorb to the surface of the substrate at a system pressure of 100 Pa for 10 seconds, to thereby form a precursor thin-film.

(2) The raw material gas that has not adsorbed to the surface of the substrate is evacuated from the system through argon purging for 15 seconds.

(3) A reactive gas is introduced into the film formation chamber, and the precursor thin-film and the reactive gas are caused to react with each other at a system pressure of 100 Pa for 0.5 second.

(4) The reactive gas that is unreacted and a by-product gas are evacuated from the system through argon purging for 60 seconds.

Example 4

Production of Indium-containing Thin-film by ALD Method

An indium-containing thin-film was produced on a silicon substrate under the same conditions as those of Example 3 except that Compound No. 47 was used as a thin-film forming raw material. The composition of the thin-film was analyzed by using X-ray photoelectron spectroscopy. As a result, the thin-film was a thin-film containing an indium oxide, and its residual carbon amount was less than 0.1 atm % that was a detection limit. The film thickness of the thin-film was measured by an X-ray reflectivity method. As a result, the film thickness was 10 nm, and hence a film thickness obtained per cycle was about 0.02 nm.

Comparative Example 2

An indium-containing thin-film was produced on a silicon substrate under the same conditions as those of Example 3 except that Comparative Compound 1 (trimethylindium) was used as a thin-film forming raw material. The composition of the thin-film was analyzed by using X-ray photoelectron spectroscopy. As a result, the thin-film was a thin-film containing an indium oxide, and its residual carbon amount was 11 atm %. In addition, the state of the thin-film was observed by using scanning electron microscopy. As a result, the thin-film formed on the substrate was not smooth, and hence its film thickness could not be measured by an X-ray reflectivity method.

It was recognized from the foregoing that when a thin-film was produced by using the indium compound of the present invention as a thin-film forming raw material, a high-quality indium-containing thin-film was able to be produced.

The invention claimed is:

1. An indium compound, which is represented by the following general formula (1):

(1)

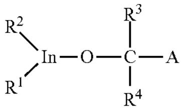

where $R^1$ and $R^2$ each independently represent an unsubstituted alkyl group having 1 to 5 carbon atoms, or an alkyl group having 1 to 5 carbon atoms that is substituted with a fluorine atom, $R^3$ and $R^4$ each independently represent a hydrogen atom, a fluorine atom, an unsubstituted alkyl group having 1 to 5 carbon atoms, or an alkyl group having 1 to 5 carbon atoms that is substituted with a fluorine atom, provided that $R^3$ and $R^4$ are not each a hydrogen atom, and A represents a group represented by the following general formula (L-1) or (L-2):

(L-1)

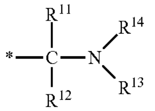

(L-2)

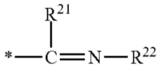

where $R^{11}$, $R^{12}$, $R^{13}$, $R^{14}$, $R^{21}$, and $R^{22}$ each independently represent a hydrogen atom, a fluorine atom, an unsubstituted alkyl group having 1 to 5 carbon atoms, or an alkyl group having 1 to 5 carbon atoms that is substituted with a fluorine atom, and * represents a bonding position with C in the general formula (1).

2. A thin-film forming raw material, comprising the indium compound of claim 1.

3. A method of producing a thin-film, comprising forming a thin-film containing an indium atom on a surface of a substrate through use of a raw material gas obtained by vaporizing the thin-film forming raw material of claim 2.

4. The method of producing a thin-film according to claim 3, wherein the method comprises:

a step 1 of causing the raw material gas to adsorb to the surface of the substrate to form a precursor thin-film; and a step 2 of causing the precursor thin-film to react with a reactive gas to form the thin-film containing an indium atom on the surface of the substrate.

5. The method of producing a thin-film according to claim 4, wherein the reactive gas is an oxidizing gas, and wherein the thin-film containing an indium atom is indium oxide.

6. The method of producing a thin-film according to claim 5, wherein the oxidizing gas is a gas containing at least one selected from the group consisting of: oxygen; ozone; and water vapor.

7. The method of producing a thin-film according to claim 4, wherein the step 2 is performed in a range of from 150° C. to 400° C.

8. The indium compound according to claim 1, wherein in the general formula (1), $R^3$ represents a fluorine atom, an unsubstituted alkyl group having 1 to 5 carbon atoms, or an alkyl group having 1 to 5 carbon atoms that is substituted with a fluorine atom, and $R^4$ represents a hydrogen atom, a fluorine atom, an unsubstituted alkyl group having 1 to 5 carbon atoms, or an alkyl group having 1 to 5 carbon atoms that is substituted with a fluorine atom.

* * * * *